United States Patent
Hwang et al.

(10) Patent No.: US 6,984,716 B2
(45) Date of Patent: Jan. 10, 2006

(54) PHOSPHORUS-CONTAINING COMPOUND

(75) Inventors: Kuen-Yuan Hwang, Hsinchu Industrial District (TW); An-Pang Tu, Hsinchu Industrial District (TW); Chi-Yi Ju, Hsinchu Industrial District (TW); Ching-Chung Lin, Hsinchu Industrial District (TW)

(73) Assignee: Chang Chun Plastics Co., Ltd., Taipei (TW)

( * ) Notice: Subject to any disclaimer, the term of this patent is extended or adjusted under 35 U.S.C. 154(b) by 161 days.

(21) Appl. No.: 10/394,250

(22) Filed: Mar. 24, 2003

(65) Prior Publication Data

US 2004/0077825 A1   Apr. 22, 2004

(30) Foreign Application Priority Data

Oct. 22, 2002   (TW)   ............... 91124299 A

(51) Int. Cl.
   *C08G 79/02*   (2006.01)

(52) U.S. Cl. ............... 528/398; 528/400; 528/244; 528/487; 528/495

(58) Field of Classification Search ............... 528/398, 528/400, 244, 487, 495
   See application file for complete search history.

(56) References Cited

U.S. PATENT DOCUMENTS 6,441,067 B1 *   8/2002   Chiu et al. ............... 524/117

* cited by examiner

*Primary Examiner*—Duc Truong
(74) *Attorney, Agent, or Firm*—Bacon & Thomas

(57) ABSTRACT

A phosphorus-containing compound represented by formula (I) and a preparation method thereof are provided. An addition reaction is performed for an organic cyclic phosphorus compound with an aryl aldehyde compound, and then a condensation reaction is performed with an aryl compound having active hydrogen in the use of an organic acid as a catalyst to obtain the proposed phosphorus-containing compound. This phosphorus-containing compound can be used as a hardener for resin, and improves flame retardant properties and thermal resistance for a flame retardant epoxy resin composition, thereby suitably applied to resin compositions used for manufacturing printed circuit boards and laminated circuit boards in electronic or electric products.

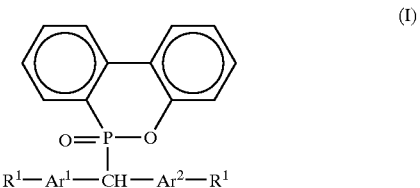

(I)

19 Claims, No Drawings

PHOSPHORUS-CONTAINING COMPOUND

FIELD OF THE INVENTION

The present invention relates to phosphorus-containing compounds and preparation methods thereof, and more particularly, to a phosphorus-containing compound which can directly react to form phosphorus-containing epoxy resin or serve as a hardener for an epoxy resin composition.

BACKGROUND OF THE INVENTION

Due to good resistance to solvents, excellent mechanical strength, electrically insulating properties and size stability, epoxy resin has been widely applied to coating materials, electrically insulating materials, printed circuit laminated boards and electronic packaging materials, construction and building materials, adhesives, and navigation technology. However, epoxy resin has primary defects of poor thermal resistance and burning easily, which may set significant restriction on the uses of epoxy resin. Therefore, with development of electronic technology, it is desired to improve flame retardant properties and thermal resistance of epoxy resin in compliance with increase in the requirements for these properties.

There have been a plurality of techniques available for improving the flame retardant properties of epoxy resin, the most common one of which is to introduce a flame retardant into an epoxy resin compound or a hardener thereof. Generally, a halogen-containing flame retardant is used. Although halogens are effective for retarding flames, they would produce erosive and toxic hydrogen halide gases. According to relevant legal rules and in concern of environmental protection, the halogen-containing flame retardant is getting prohibited in use. Therefore, it is critical to develop a novel flame retardant.

It has been reported that a phosphorus-containing flame retardant has significant advantages of low toxicity, good processing properties, low usage amount, and good compatibility with resin, making the phosphorus-containing flame retardant gradually accepted in wide applications. During a burning process of the phosphorus-containing flame retardant, on the one hand, polymeric materials are urged to undergo a dehydration reaction by which hydrogen of carbohydrate reacts with oxygen of air to form water so as to reduce an ambient temperature and thereby provide a flame retardant effect. On the other hand, phosphoric acid is decomposed under a high temperature, making polymeric compounds carbonized to form a flame retardant coke layer; moreover, phosphoric acid would be further dehydrated and esterized under the high temperature to form glass-like melted polymeric phosphoric acid that covers surfaces of burning substances and serves as a protective layer for preventing oxygen from entering into non-burning internal portions of polymers and for impeding release of volatile decomposed substances, thereby inhibiting proliferation of flames and achieving the flame retardant effect.

Currently used phosphorus-containing substances can be divided into reactive phosphorus-containing compounds with function groups, and generally non-reactive phosphorus-containing compounds. The non-reactive phosphorus-containing compounds have relatively poor thermal resistance and are not suitably applied to epoxy resin compositions required to be highly thermal resistant. The reactive phosphorus-containing compounds bonded to other molecules can thus have relatively higher thermal stability and thereby become a mainstream of usage.

Among available reactive phosphorus-containing compounds, the most commonly used is a linear phosphorus-containing compound; however, due to an —O—P—O— bond on a main chain thereof, this linear phosphorus-containing compound has poorer thermal resistance than a normal halogen-containing or halogen-free epoxy resin composition. In another aspect, phosphorus-containing flame retardant resin compositions, no matter having linear phosphorus-containing compounds or non-reactive phosphorus-containing compounds, are worse in processing properties than bromine-containing epoxy resin compositions in practical applications. Therefore, it is deemed hard to enhance both the flame retardant properties and thermal resistance of the resin compositions.

In accordance with the foregoing problems, it is here to provide a novel phosphorus-containing compound and a preparation method thereof. This phosphorus-containing compound has a different side chain structure from a conventional linear phosphorus-containing compound, which not only can react to form phosphorus-containing epoxy resin by means of various addition or epoxidation reactions but also can directly act as a hardener in an epoxy resin composition. This would effectively improve flame retardant properties and thermal resistance of the resin composition, thereby particularly suitable for epoxy resin compositions required to be highly thermal resistant.

SUMMARY OF THE INVENTION

An objective of the present invention is to provide a phosphorus-containing compound represented by formula (I) with symbols thereof being defined hereinafter. This compound can be used to form flame retardant phosphorus-containing resin, and also can serve as a hardener for a flame retardant epoxy resin composition.

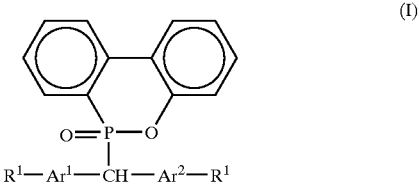

Another objective of the invention is to provide a method for preparing the phosphorus-containing compound, which performs an addition reaction for an organic cyclic phosphorus compound with an aryl aldehyde compound and performs a condensation reaction for an organic acid as a catalyst with an aryl compound having active hydrogen so as to form the phosphorus-containing compound according to the invention.

DETAILED DESCRIPTION OF THE PREFERRED EMBODIMENTS

The present invention provides a phosphorus-containing compound represented by formula (I):

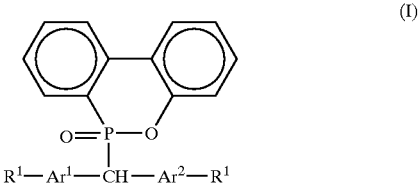

wherein $R^1$ is selected from the group consisting of —OH, —COOH, —NH$_2$, —CHO, —SH, —SO$_3$H, —CONH$_2$, —NHCOOR$^4$, and anhydride, and $R^4$ is hydrogen or alkyl; $Ar^1$ and $Ar^2$ are independently selected from:

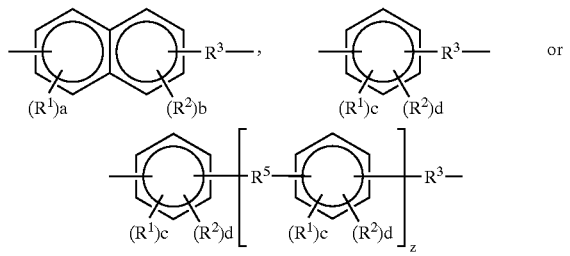

wherein $R^2$ is selected from the group consisting of hydrogen, alkyl group, alkoxyl group, nitro group, halogen, and aryl group; $R^3$ is a chemical bond or an alkylene group; $R^5$ is selected from the group consisting of a chemical bond, —CR$^2$R$^4$—, —O—, —CO—, —S—, —SO—, and —SO$_2$—; $R^1$ and $R^4$ are defined as above; a and b are independently an integer from 0 to 6, and a+b≦6; c and d are independently an integer from 0 to 4, and c+d≦4; and z is an integer from 1 to 20.

The alkyl group represented by $R^2$ and $R^4$ is a linear, branched or cyclic alkyl group, including: methyl, ethyl, propyl, isopropyl, butyl, isobutyl, s-butyl, t-butyl, pentyl, 2-pentyl, 3-pentyl, 2-methyl-1-butyl, isopentyl, s-pentyl, 3-methyl-2-butyl, neopentyl, hexyl, 4-methyl-2-pentyl, cyclopentyl, cyclohexyl, and the like. The alkylene group represented by $R^3$ includes: methylene, ethylene, propylene, butylene, pentylene, and hexylene, and the like. The alkoxyl group represent by $R^2$ includes: methoxyl, ethoxyl, propoxyl, isopropoxyl, butoxyl, isobutoxyl, s-butoxyl, t-butoxyl, pentoxyl, isopentoxyl, neopentoxyl, hexoxyl, cyclohexoxyl, and the like. The aryl group represent by $R^2$ includes: phenyl, methyl phenyl, dimethyl phenyl, benzyl, naphthyl, and the like.

The phosphorus-containing compound represented by formula (I) is prepared by performing an addition reaction for a reactive organic cyclic phosphorus compound having a single function group with an aryl aldehyde compound to form a phosphorus-containing compound having an alcohol group, and then performing a condensation reaction for the phosphorus-containing compound having an alcohol group with an aryl compound at least having a substituent of —OH, —COOH, —NH$_2$, —CHO, —SH, —SO$_3$H, —CONH$_2$, —NHCOOR$^4$, or anhydride in the use of an organic acid as a catalyst.

An example of the reactive organic cyclic phosphorus compound have a single function group is 9,10-dihydro-9-oxo-10-phosphorous phenanthrenyl-10-oxide represented by formula (II):

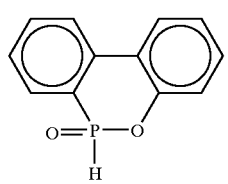

The aryl aldehyde compound for preparation of the phosphorus-containing compound according to the invention at least has a substituent selected from the group consisting of —OH, —COOH, —NH$_2$, —CHO, —SH, —SO$_3$H, —CONH$_2$, —NHCOOR$^4$, and anhydride, and includes a substituted or unsubstituted benzaldehyde compound or naphthaldehyde compound. The benzaldehyde compound may be the one represented by formula (III):

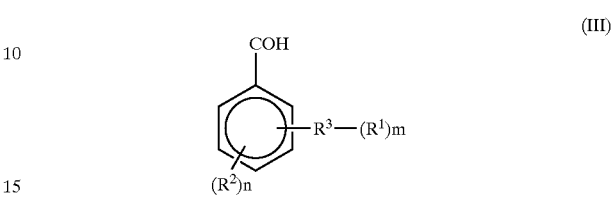

wherein $R^1$, $R^2$ and $R^3$ are defined as above; m is an integer from 1 to 5; and n is an integer from 0 to 4, and m+n≦5.

Examples of the benzaldehyde compound include, but not limited to, hydroxyl benzaldehyde, hydroxyl methyl benzaldehyde, hydroxyl ethyl benzaldehyde, hydroxyl isopropyl benzaldehyde, carboxyl benzaldehyde, carboxyl methyl benzaldehyde, carboxyl ethyl benzaldehyde, carboxyl isopropyl benzaldehyde, amino benzaldehyde, amino methyl benzaldehyde, amino ethyl benzaldehyde, amino isopropyl benzaldehyde, phenyl dialdehyde, hydroxyl phenyl dialdehyde, carboxyl phenyl dialdehyde, and amino phenyl dialdehyde that are substituted or unsubstituted by alkyl, alkoxyl, nitro, halogen, or aryl; and phenyl thiophenol, hydroxyl phenyl thiophenol, carboxyl phenyl thiophenol, amino phenyl thiophenol, benzyl thiophenol, hydroxyl benzyl thiophenol, carboxyl benzyl thiophenol, amino benzyl thiophenol, phenyl sulfonic acid, hydroxyl phenyl sulfonic acid, carboxyl phenyl sulfonic acid, amino phenyl sulfonic acid, benzamide, hydroxyl benzamide, carboxyl benzamide, amino benzamide, phenyl amino methyl formate, phenyl amino ethyl formate, phenyl amino isopropyl formate, benzyl amino methyl formate, benzyl amino ethyl formate, phenyl dimethyl anhydride, benzenediol, phenyl dicarboxylic acid, phenyl disulfonic acid, and phenyl diamide each of which has at least one aldehyde group on a benzene ring thereof; and the like.

Examples of the naphthaldehyde compound for preparation of the phosphorus-containing compound according to the invention include, but not limited to, naphthaldehyde, hydroxyl naphthaldehyde, hydroxyl methyl naphthaldehyde, hydroxyl ethyl naphthaldehyde, hydroxyl isopropyl naphthaldehyde, carboxyl naphthaldehyde, carboxyl methyl naphthaldehyde, carboxyl ethyl naphthaldehyde, carboxyl isopropyl naphthaldehyde, amino naphthaldehyde, amino methyl naphthaldehyde, amino ethyl naphthaldehyde, amino isopropyl naphthaldehyde, naphthyl dialdehyde, hydroxyl naphthyl dialdehyde, carboxyl naphthyl dialdehyde, and amino naphthyl dialdehyde that are substituted or unsubstituted by alkyl, alkoxyl, nitro, halogen, or aryl; and naphthyl thiophenol, hydroxyl naphthyl thiophenol, carboxyl naphthyl thiophenol, amino naphthyl thiophenol, naphthyl methyl thiophenol, hydroxyl naphthyl methyl thiophenol, carboxyl naphthyl methyl thiophenol, amino naphthyl methyl thiophenol, naphthyl sulfonic acid, hydroxyl naphthyl sulfonic acid, carboxyl naphthyl sulfonic acid, amino naphthyl sulfonic acid, naphthamide, hydroxyl naphthamide, carboxyl naphthamide, amino naphthamide, naphthyl amino methyl formate, naphthyl amino ethyl formate, naphthyl amino isopropyl formate, naphthyl methyl amino methyl formate, naphthyl methyl amino ethyl formate, naphthyl dimethyl anhydride, naphthyl diphenol, naphthyl dicarboxylic acid, naphthyl disulfonic acid, and naphthyl diamide each of which has at least an aldehyde group on a naphthyl ring thereof; and the like.

Besides the above benzaldehyde compounds and naphthaldehyde compounds, other aryl aldehyde compounds with each benzene ring at least having an aldehyde group are also suitable for preparing the phosphorus-containing compound according to the invention. Examples of these aryl aldehyde compounds include, but not limited to, diphenyl compounds, dephenyl alkyl compounds, dephenyl ether compounds, dephenyl methyl ketone compounds, dephenyl thioether compounds, dephenyl sulfoxide compounds, and dephenyl sulfone compounds each of which has at least an aldehyde group on a benzene ring thereof, and the like.

The aryl compound for the condensation reaction with the above phosphorus-containing compound having an alcohol group is represented by the following formula (IV) or (V):

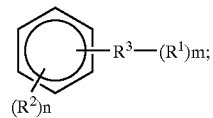
(IV)

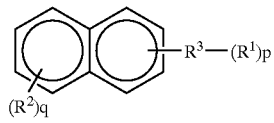
(V)

wherein $R^1$, $R^2$ and $R^3$ are defined as above; m is an integer from 1 to 5; n is an integer from 0 to 4, and $m+n \leq 5$; p is an integer from 1 to 7; and q is an integer from 0 to 6, and $p+q \leq 7$.

Besides the aryl compound represented by formula (IV) or (V), the condensation reaction can be performed for the above phosphorus-containing compound having an alcohol group with a diphenyl compound, dephenyl alkyl compound, dephenyl ether compound, dephenyl methyl ketone compound, dephenyl thioether compound, dephenyl sulfoxide compound, and dephenyl sulfone compound each of which has at least a substituent of —OH, —COOH, —NH$_2$, —CHO, —SH, —SO$_3$H, —CONH$_2$, —NHCOOR$^4$, or anhydride.

Aryl compounds subject to a condensation reaction with phosphorus-containing compounds having alcohol groups preferably have hydroxyl groups, carboxyl groups, or amine groups. Examples thereof include, but not limited to, phenol, phenyl methanol, phenyl ethanol, benzoic acid, phenyl acetic acid, phthalatic acid, hydroxyl benzoic acid, aniline, benzyl amine, amino phenol, amino phenyl sulfonic acid, amino phenol sulfonic acid, hydroxyl methyl aniline, hydroxyl ethyl aniline, amino benzoic acid, naphthol, 2,6-dihydroxy naphthalene, naphthyl formic acid, naphthyl diformic acid, naphthyl amine, naphthyl diamine, amino naphthol, amino naphthyl sulfonic acid, amino naphthyl phenol sulfonic acid, hydroxyl methyl naphthyl amine, hydroxyl ethyl naphthyl amine, and amino naphthyl formic acid.

Beside the above aryl compounds, the phosphorus-containing compound according to the invention can be prepared through the use of the following aryl compounds including: 4-hydroxyl diphenyl, 4,4'-dihydroxyl diphenyl, 4-carboxyl diphenyl, 4,4'-dicarboxyl diphenyl, 2,2-bi(4-hydroxyl phenyl)propane, 2-(3-hydroxyl phenyl)-2-(4'-hydroxyl phenyl)propane, bi(4-hydroxyl phenyl)methane, 2,2-bi(4-carboxyl phenyl)propane, 2-(3-carboxyl phenyl)-2-(4'-carboxyl phenyl)propane, bi(4-carboxyl phenyl)methane, 4-hydroxyl phenyl ether, bi(2-hydroxyl benzene)ether, bi(3-hydroxyl benzene)ether, bi(4-hydroxyl benzene)ether, 4-carboxyl phenyl ether, bi(2-carboxyl benzene)ether, bi(3-carboxyl benzene)ether, bi(4-carboxyl benzene)ether, 4-hydrozyl dibenzyl ketone, bi(2-hydroxyl benzene)methyl ketone, bi(3-hydroxyl benzene)methyl ketone, bi(4-hydroxyl benzene)methyl ketone, 4-carboxyl dibenzyl ketone, bi(2-carboxyl benzene)methyl ketone, bi(3-carboxyl benzene)methyl ketone, bi(4-carboxyl benzene)methyl ketone, 2-hydroxyl-4-methyl dibenzyl ketone, 2-hydroxyl-4-methoxydibenzyl ketone, 2,2'-dihydroxyl-4,4'-dimethyl dibenzyl ketone, 4-carboxyl-2-methyl dibenzyl ketone, 4-amino dibenzyl ketone, 4-hydroxyl diphenyl thioether, bi(2-hydroxyl benzene)thioether, bi(3-hydroxyl benzene)thioether, bi(4-hydroxyl benzene)thioether, 4-carboxyl diphenyl thioether, bi(2-carboxyl benzene)thioether, bi(3-carboxyl benzene)thioether, bi(4-carboxyl benzene)thioether, 2-hydroxyl-4-methyldiphenyl thioether, 2-hydroxyl-4-methoxydiphenyl thioether, 2,2'-duhydroxyl, 4,4'-dimethyl diphenyl thioether, 4carboxyl-2-methyl diphenyl thioether, 4-amino diphenyl thioether, bi(2-hydroyl benzene)sulfoxide, bi(3-hydroxyl benzene)sulfoxide, bi(4-hydroxyl benzene)sulfoxide, bi(2-carboxyl benzene)sulfoxide, bi(3-carboxyl benzene)sulfoxide, bi(4-carboxyl benzene)sulfoxide, bi(2,3-dihydroxyl benzene)sulfoxide, bi(5-chloro-2,3-dihydroxyl benzene)sulfoxide, bi(2,4-dihydroxyl benzene)sulfoxide, bi(2,4-dihydroxyl-6-methyl benzene)sulfoxide, bi(5-chloro-2,4-dihydroxyl benzene)sulfoxide, bi(2,5-dihydroxyl benzene)sulfoxide, bi(3,4-dihydroxyl benzene)sulfoxide, bi(3,5-dihydroxyl benzene)sulfoxide, bi(2,3,4-trihydroxyl benzene)sulfoxide, bi(2,3,4-trihydroxyl-6-methyl benzene) sulfoxide, bi(5-chloro-2,3,4-trihydroxyl benzene)sulfoxide, bi(2,4,6-trihydroxyl benzene)sulfoxide, bi(5-chloro-2,4,6-trihydroxyl benzene)sulfoxide, bi(2-hydroxyl benzene)sulfone, bi(3-hydroxyl benzene)sulfone, bi(4-hydroxyl benzene)sulfone, bi(2-carboxyl benzene)sulfone, bi(3-carboxyl benzene)sulfone, bi(4-carboxyl benzene)sulfone, bi(2,4-dihydroxyl benzene)sulfone, bi(3,4-dihydroxyl benzene)sulfone, bi(3,5-dihydroxyl benzene)sulfone, bi(3,6-dihydroxyl benzene)sulfone, and bi(3,5-dimethyl-4-hydroxyl benzene) sulfone; and the like.

The organic acid as a catalyst for preparation of the phosphorus-containing compound according to the invention may be substituted or unsubstituted carboxylic acid or sulfonic acid. Examples thereof include, but not limited to, formic acid, acetic acid, propionic acid, butyric acid, 2-methyl propionic acid, pentanoic acid, 3-methyl butyric acid, 2-methyl butyric acid, hexanoic acid, heptylic acid, octanoic acid, oxalic acid, malonic acid, succinic acid, glutaric acid, adipic acid, sebacic acid, hydroxyacetic acid, lactic acid, tartaric acid, citric acid, malic acid, ethylene diamine tetraacetic acid, salicylic acid cyclohexyl carboxylic acid, 1,4-cyclohexyl dicarboxylic acid, benzoic acid, phthalatic acid, phenyl tricarboxylic acid, trifluoro methyl sulfonic acid, ethyl sulfonic acid, propyl sulfonic acid, phenyl sulfonic acid, phenyl disulfonic acid, naphthyl disulfonic acid, and p-toluene sulfonic acid.

The phosphorus-containing compound according to the invention can be prepared as follows. An addition reaction is performed for an organic cyclic phosphorus compound represented by the above formula (II) with an aryl aldehyde compound to form a phosphorus-containing compound having an alcohol group. With respect to 1 mol of the organic cyclic phosphorus compound represented by formula (II), an amount of the aryl aldehyde compound used is 0.7 to 1.3 mol, preferably 0.8 to 1.2 mol, and more preferably 0.9 to 1.1 mol. There is no particular limitation to reaction conditions for the addition reaction. A reaction temperature is preferably 80° C. to 160° C., and the reaction time is preferably longer than 0.5 hour. It should be understood that the reaction conditions may be modulated according to practical requirements. After the phosphorus-containing compound having an alcohol group is obtained, an organic acid is used as a catalyst, and a condensation reaction is performed for the obtained phosphorus-containing compound having an alcohol group with an aryl compound at least having a substituent of —OH, —COOH, —NH$_2$, —CHO, —SH, —SO$_3$H, —CONH$_2$, —NHCOOR$^4$, or anhydride, to thereby obtain the phosphorus-containing compound represented by formula (I) according to the invention. With respect to 1 mol of the phosphorus-containing compound having an alcohol group obtained from the addition reaction, an amount of the aryl compound used for the condensation reaction is greater than 0.8 mol, preferably greater than 1 mol, and more preferably more than 3.5 to 7 mol. An amount of the organic acid or catalyst is not particularly limited, but preferably 0.01 to 5 wt % of the total weight of the reactants. There is no particular limitation to reaction conditions for the condensation reaction. A reaction temperature is preferably above 90° C., and the reaction time is preferably longer than 2 hours. It should be understood that the reaction conditions may be modulated according to practical requirements.

The present invention also provides a method for preparing the phosphorus-containing compound represented by formula (I), including the steps of: (1) performing an addition reaction for an aryl aldehyde compound with an organic cyclic phosphorus compound represented by formula (II) to form a phosphorus-containing compound having an alcohol group, wherein an amount of the aryl aldehyde compound used is 0.7 to 1.3 mol with respect to 1 mol of the organic cyclic phosphorus compound represented by formula (II); and (2) performing a condensation reaction for the phosphorus-containing compound having an alcohol group obtained from the addition reaction with an aryl compound at least having a substituent of —OH, —COOH, —NH$_2$, —CHO, —SH, —SO$_3$H, —CONH$_2$, —NHCOOR$^4$, or anhydride, wherein an amount of the aryl compound used for the condensation reaction is greater than 0.8 mol with respect to 1 mol of the obtained phosphorus-containing compound having an alcohol group.

The invention can be more fully understood by reading the following Examples which should not set any restriction to the scope embraced by this invention.

EXAMPLES

Example 1

216 g of 9,10-dihydro-9-oxo-10-phosphorous phenanthrenyl-10-oxide and 216 g of toluene are placed in a glass reactor and heated and stirred to dissolve. When the temperature reaches 110° C., 112 g of 4-hydroxybenzaldehyde is added and reacts for more than 3 hours. After the temperature cools to room temperature, the reactants are filtered and dried to obtain an organic cyclic phosphorus compound, (9,10-dihydro-9oxo-10-phosphorous phenanthrenyl-10-oxide-10-yl)-(4-hydroxyphenyl)methanol (hereinafter abbreviated as HCAB) with a melting point of 212° C.

338 g of the organic cyclic phosphorus compound (HCAB) and 338 g of toluene are placed in a glass reactor and heated and stirred to dissolve. When the temperature reaches 110° C., 94 g of phenol and 1.6 g of p-toluene sulfonic acid are added and react for more than 3 hours. After the temperature cools to room temperature, the reactants are filtered and dried to obtain the phosphorus-containing compound according to the invention, (9,10-dihydro-9-oxo-10-phosphorous phenanthrenyl-10-oxide-10-yl)-bi(4-hydroxyphenyl)methane (hereinafter abbreviated as HPP) with a melting point of 291° C. Element composition of the phosphorus-containing compound (HPP) is analyzed below:

|  | C % | H % | P % |
| --- | --- | --- | --- |
| Measured value | 72.7% | 4.6% | 7.4% |
| Calculated value | 72.46% | 4.59% | 7.49% |

(formula weight of $C_{25}H_{19}O_4P$ = 414)

Example 2

216 g of 9,10-dihydro-9-oxo-10-phosphorous phenanthrenyl-10-oxide and 216 g of toluene are placed in a glass reactor and heated and stirred to dissolve. When the temperature reaches 110° C., 112 g of 4-hydroxybenzaldehyde is added and reacts for more than 3 hours. After the temperature cools to room temperature, the reactants are filtered and dried to obtain an organic cyclic phosphorus compound, (9,10-dihydro-9oxo-10-phosphorous phenanthrenyl-10-oxide-10-yl)-(4-hydroxyphenyl)methanol (hereinafter abbreviated as HCAB) with a melting point of 212° C.

338 g of the organic cyclic phosphorus compound (HCAB) and 338 g of toluene are placed in a glass reactor and heated and stirred to dissolve. When the temperature reaches 110° C., 94 g of phenol and 3.4 g of oxalic acid are added and react for more than 3 hours. After the temperature cools to room temperature, the reactants are filtered and dried to obtain the phosphorus-containing compound according to the invention, (9,10-dihydro-9-oxo-10-phosphorous phenanthrenyl-10-oxide-10-yl)-bi(4-hydroxyphenyl)methane (hereinafter abbreviated as HPP) with a melting point of 291° C. Element composition of the phosphorus-containing compound (HPP) is analyzed below:

|  | C % | H % | P % |
| --- | --- | --- | --- |
| Measured value | 72.7% | 4.6% | 7.4% |
| Calculated value | 72.46% | 4.59% | 7.49% |

(formula weight of $C_{25}H_{19}O_4P$ = 414)

Example 3

216 g of 9,10-dihydro-9-oxo-10-phosphorous phenanthrenyl-10-oxide and 216 g of toluene are placed in a glass reactor and heated and stirred to dissolve. When the temperature reaches 110° C., 112 g of 4-hydroxybenzaldehyde is added and reacts for more than 3 hours. After the temperature cools to room temperature, the reactants are filtered and dried to obtain an organic cyclic phosphorus compound, (9,10-dihydro-9oxo-10-phosphorous phenanthrenyl-10-oxide-10-yl)-(4-hydroxyphenyl)methanol (hereinafter abbreviated as HCAB) with a melting point of 212° C.

338 g of the organic cyclic phosphorus compound (HCAB) and 338 g of toluene are placed in a glass reactor and heated and stirred to dissolve. When the temperature reaches 110° C., 108 g of o-cresol and 1.6 g of p-toluene sulfonic acid are added and react for more than 3 hours. After the temperature cools to room temperature, the reactants are filtered and dried to obtain the phosphorus-containing compound according to the invention, (9,10-dihydro-9-oxo-10-phosphorous phenanthrenyl-10oxide-10-yl)-bi(4-hydroxy-2methylphenyl)methane (hereinafter abbreviated as HPC) with a melting point of 245° C.

What is claimed is:

1. A phosphorus-containing compound represented by formula (I):

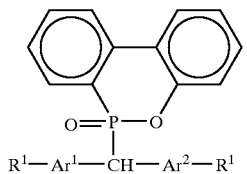

wherein $R^1$ is selected from the group consisting of —OH, —COOH, —NH$_2$, —CHO, —SH, —SO$_3$H, —CONH$_2$, —NHCOOR$^4$, and anhydride; $R^4$ is hydrogen or an alkyl group; and Ar$^1$ and Ar$^2$ are independently selected from:

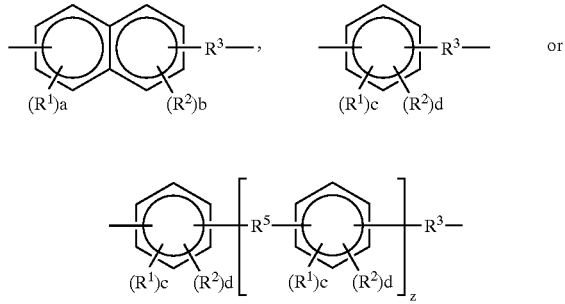

wherein $R^2$ is selected from the group consisting of hydrogen, alkyl group, alkoxyl group, nitro group, halogen, and aryl group; $R^3$ is a chemical bond or an alkylene group; $R^5$ is selected from the group consisting of a chemical bond, —CR$^2$R$^4$—, —O—, —CO—, —S—, —SO—, and —SO$_2$—; $R^1$ and $R^4$ are defined as above; a and b are independently an integer from 0 to 6, and a+b≦6; c and d are independently an integer from 0 to 4, and c+d≦4; and z is an integer from 1 to 20.

2. The phosphorus-containing compound of claim 1, wherein Ar$^1$ and Ar$^2$ are alkylene groups; and $R^1$ is selected from the group consisting of —OH—, —COOH—, and —NH$_2$.

3. The phosphorus-containing compound of claim 1, wherein the compound is prepared by an addition reaction performed for an organic cyclic phosphorus compound with an aryl aldehyde compound and a condensation reaction performed with an aryl compound at least having a substituent selected from the group consisting of —OH, —COOH, —NH$_2$, —CHO, —SH, —SO$_3$H, —CONH$_2$, —NHCOOR$^4$, and anhydride.

4. The phosphorus-containing compound of claim 3, wherein the organic cyclic phosphorus compound is 9,10-dihydro-9-oxo-10-phosphorous phenanthrenyl-10-oxide.

5. The phosphorus-containing compound of claim 3, wherein the aryl aldehyde compound is a benzaldehyde compound represented by formula (III):

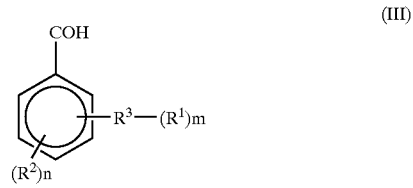

wherein $R^1$, $R^2$, $R^3$, m and n are defined as above.

6. The phosphorus-containing compound of claim 5, wherein the benzaldehyde compound is selected from the group consisting of hydroxybenzaldehyde, carboxybenzaldehyde, carboxymethyl benzaldehyde, carboxyethyl benzaldehyde, dicarboxy benzaldehyde, aminobenzaldehyde, aminomethyl benzaldehyde, and aminoethyl benzaldehyde.

7. The phosphorus-containing compound of claim 6, wherein the benzaldehyde compound is 4-hydroxy benzaldehyde.

8. The phosphorus-containing compound of claim 3, wherein the aryl compound at least having a substituent selected from the group consisting of —OH, —COOH, —NH$_2$, —CHO, —SH, —SO$_3$H, —CONH$_2$, —NHCOOR$^4$, and anhydride is represented by formula (IV):

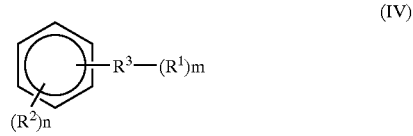

wherein $R^1$, $R^2$, $R^3$, m and n are defined as above.

9. The phosphorus-containing compound of claim 8, wherein $R^1$ of the aryl compound represented by formula (IV) is selected from the group consisting of —OH, —COOH, and —NH$_2$.

10. The phosphorus-containing compound of claim 9, wherein the aryl compound is selected from the group consisting of phenol, o-cresol, benzoic acid, phenylacetic acid, aniline, benzyl amine, and phenyl ethyl amine.

11. A method for preparing the phosphorus-containing compound of claim 1, comprising the steps of:
(1) performing an addition reaction for an aryl aldehyde compound with the organic cyclic phosphorus compound represented by formula (II) to form a phosphorus-containing compound having an alcohol group; and
(2) performing a condensation reaction for the phosphorus-containing compound having an alcohol group obtained from the addition reaction with an aryl compound at least having a substituent selected from the group consisting of —OH, —COOH, —NH$_2$, —CHO, —SH, —SO$_3$H, —CONH$_2$, —NHCOOR$^4$, and anhydride in the use of an organic acid as a catalyst.

12. The method of claim 11, wherein the aryl aldehyde compound is a benzaldehyde compound represented by formula (III):

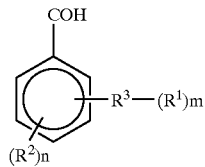

(III)

wherein $R^1$, $R^2$, $R^3$, m and n are defined as above.

13. The method of claim 12, wherein the benzaldehyde compound is selected from the group consisting of hydroxybenzaldehyde, carboxybenzaldehyde, carboxymethyl benzaldehyde, carboxyethyl benzaldehyde, dicarboxy benzaldehyde, aminobenzaldehyde, aminomethyl benzaldehyde, and aminoethyl benzaldehyde.

14. The method of claim 11, wherein an amount of the aryl aldehyde compound used is 0.7 to 1.3 mol with respect to 1 mol of the organic cyclic phosphorus compound.

15. The method of claim 11, wherein the aryl compound for the condensation reaction is represented by formula (IV):

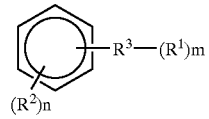

(IV)

wherein $R^1$, $R^2$, $R^3$, m and n are defined as above.

16. The method of claim 15, wherein the aryl compound is selected from the group consisting of phenol, o-cresol, benzoic acid, phenylacetic acid, aniline, benzyl amine, and phenyl ethyl amine.

17. The method of claim 11, wherein an amount of the aryl compound used for the condensation reaction is greater than 0.8 mol with respect to 1 mol of the phosphorus-containing compound having an alcohol group.

18. The method of claim 11, wherein the organic acid is p-toluenesulfonic acid.

19. The method of claim 11, wherein the organic acid is oxalic acid.

* * * * *